United States Patent
Liu et al.

(10) Patent No.: US 9,685,973 B2
(45) Date of Patent: Jun. 20, 2017

(54) SUCCESSIVE APPROXIMATION REGISTER (SAR) ANALOG-TO-DIGITAL CONVERTING CIRCUIT AND METHOD THEREOF

(71) Applicant: REALTEK SEMICONDUCTOR CORP., Hsinchu (TW)

(72) Inventors: Kai-Yin Liu, Hsinchu (TW); Che-Wei Chang, Hsinchu (TW); Sheng-Hsiung Lin, Hsinchu (TW); Shih-Hsiun Huang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/285,086

(22) Filed: Oct. 4, 2016

(65) Prior Publication Data

US 2017/0126243 A1    May 4, 2017

(30) Foreign Application Priority Data

Oct. 30, 2015    (TW) .............................. 104135941 A

(51) Int. Cl.
H03M 1/38    (2006.01)
H03M 1/46    (2006.01)
H03M 1/12    (2006.01)
H03M 1/40    (2006.01)
H03M 1/42    (2006.01)

(52) U.S. Cl.
CPC ......... *H03M 1/466* (2013.01); *H03M 1/1245* (2013.01); *H03M 1/38* (2013.01); *H03M 1/40* (2013.01); *H03M 1/42* (2013.01)

(58) Field of Classification Search
CPC .......... H03M 1/466; H03M 1/40; H03M 1/38; H03M 1/42; H03M 1/1245
USPC .................................................. 341/155, 161
See application file for complete search history.

(56) References Cited

U.S. PATENT DOCUMENTS

| | | | |
|---|---|---|---|
| 8,456,335 B2* | 6/2013 | Oshima | H03M 1/1052 341/118 |
| 8,669,896 B2 | 3/2014 | Tsai et al. | |
| 8,912,942 B2 | 12/2014 | Lin et al. | |
| 9,319,059 B1* | 4/2016 | Sharma | H03M 1/38 |
| 9,385,740 B2* | 7/2016 | Wang | H03M 1/0854 |
| 9,444,485 B2* | 9/2016 | Pullela | H03M 1/002 |
| 9,473,162 B2* | 10/2016 | Girardi | H03M 1/001 |

OTHER PUBLICATIONS

Taiwan Patent Office, Office Action, Patent Application Serial No. TW104135941, May 25, 2016, Taiwan.
feiB Liu et al., A 10-bit 50-MS/s SAR ADC with a Monotonic Capacitor Switching Procedue, IEEE Journal of Solid-State Circuits, vol. 45, No. 4, Apr. 2010, pp. 731-740.

(Continued)

*Primary Examiner* — Brian Young
(74) *Attorney, Agent, or Firm* — Rabin & Berdo, P.C.

(57) ABSTRACT

A successive approximation register (SAR) analog-to-digital converting method includes executing a sampling operation and a comparing operation according to a conversion clock by using an SAR analog-to-digital converter (ADC) to convert an analog input signal into a digital output signal, and resetting a sampling and digital-to-analog converting circuit of the SAR ADC when a SAR procedure of the comparing operation is completed.

8 Claims, 7 Drawing Sheets

(56) References Cited

OTHER PUBLICATIONS

Hu et al., An 8-Bit Single-Ended Ultra-Low-Power SAR ADC With a Novel DAC Switching Method and a Counter-Based Digital Control Circuitry, IEEE Transactions on Circuits and Systems-I: Regular Papers, vol. 60, No. 7 Jul. 2013, pp. 1726.

Liu et al., A 1V 11FJ/Conversion-Step 10bit 10MS/s Asynchronous SAR ADC in 0.18μm CMOS, 2010 Symposium on VLSI Circuits/ Technnical Digest of Technical Papers, 2010 IEEE, pp. 241-242.

Tsai et al., A 0.003 mm 10 b 240 MS/s 0.7 mW SAR ADC in 28 nm CMOS With Digital Error Correction and Correlated-Reversed Switching, IEEE Journal of Solid-State Circuits, vol. 50, No. 6, Jun. 2015, pp. 1382-1398.

\* cited by examiner

SUCCESSIVE APPROXIMATION REGISTER (SAR) ANALOG-TO-DIGITAL CONVERTING CIRCUIT AND METHOD THEREOF

CROSS-REFERENCE TO RELATED APPLICATION

This non-provisional application claims priority under 35 U.S.C. §119(a) to Patent Application No. 104135941 filed in Taiwan, R.O.C. on Oct. 30, 2015, the entire contents of which are hereby incorporated by reference.

BACKGROUND

Technical Field

The instant disclosure relates to a converting technology between ana log and digital, and particularly relates to a successive approximation register analog-to-digital converting circuit and method thereof.

Related Art

There are multiple types of analog-to-digital converter (ADC) architectures, and these types of architectures have their own advantages. Specifically, the successive approximation register (SAR) ADC has the advantages of low power consumption, small area, and low cost, in comparison with other architecture, so that the SAR ADC is widely applied to different electronic apparatuses.

Along with the improvement in the architecture and manufacturing, the SAR ADC is developed in high speed application; especially the timing-interleaved (TI) SAR ADC architecture is widely utilized. The SAR ADC adopts a binary search algorithm to obtain a digital output code matching an input signal, therefore, the bit-cycling clock of the SAR ADC needs to be higher than the sampling frequency. Generally, the conversion rate of the SAR ADC is controlled by an external conversion clock. Each of the conversion periods of the conversion clock is divided into a sampling phase and a bit-cycling phase. In the sampling phase, the SAR ADC needs to sample an analog input signal. And then, in the bit-cycling phase, the SAR ADC digit-by-digit generates digital output codes, corresponding to the analog input signal, from the most significant bit (MSB) to the least significant bit (LSB). Accordingly, a digital output signal is generated.

Prior to the next converting period, the SAR ADC has a period of idle time (i.e., the SAR ADC does not perform any action in the idle time). The length of the idle time is determined by the process, voltage, and temperature (PVT) variations, the noise, or other factors. In order to improve the efficiency of the SAR ADC, an SAR ADC with prolonged sampling phase is developed. In the SAR ADC having prolonged sampling phase, the starting time of the sampling phase is brought forward to the toggle timing of the last bit-cycling clock. However, in the TI SAR ADC architecture, overlapping of sampling phases between different ADCs occurs, so that the signals sampled by the sampling circuit of the SAR ADC are interfered, leading the reduction of sampling quality.

SUMMARY

In one embodiment, a successive approximation register (SAR) analog-to-digital converting method is provided. The method comprises executing a sampling operation and a comparing operation according to a conversion clock by using an SAR analog-to-digital converter (ADC) to convert an analog input signal into a digital output signal, and resetting a sampling and digital-to-analog converting circuit of the SAR ADC when an SAR procedure of the comparing operation is completed.

In one embodiment, a successive approximation register (SAR) analog-to-digital converting circuit is provided. The SAR analog-to-digital converting circuit comprises an SAR analog-to-digital converter (ADC) and a resetting decision unit. The SAR ADC executes a sampling operation and a comparing operation according to a conversion clock to convert an analog input signal into a digital output signal. Wherein, the SAR ADC comprises a sampling and digital-to-analog converting circuit, a comparing circuit, and an SAR control circuit. The comparing circuit is coupled to the sampling and digital-to-analog converting circuit. The SAR control circuit is coupled to the sampling and digital-to-analog converting circuit and the comparing circuit. The resetting decision unit is coupled to the SAR control circuit and the sampling and digital-to-analog converting circuit. The resetting decision unit detects an SAR procedure of the comparing operation and resets the sampling and digital-to-analog converting circuit when the SAR procedure is completed.

Based on the above, in the SAR analog-to-digital converting circuit and method thereof, the sampling and digital-to-analog converting circuit enters into the reset state after the SAR procedure is completed (i.e., when the last cycling clock signal is pulled up). Accordingly, the idle time of an existing SAR ADC can be provided for performing the actions of the sampling and digital-to-analog converting circuit and a reference buffer in advance. Therefore, the bandwidth requirements for resetting the sampling and digital-to-analog converting circuit can be reduced, and the bandwidth requirements for actuating the reference buffer can be reduced, too. In addition, because the lower plate of the sampling and digital-to-analog converting circuit enters into the reset state in advance, the upper plate of the sampling and digital-to-analog converting circuit would recover to the current sampling value. Hence, at the timing to enter into the next sampling phase, the common mode level of the SAR ADC is recovered to the common mode level of the input buffer, so that extra recovering time can be saved. Accordingly, based on the SAR analog-to-digital converting circuit and method thereof, the design costs of the input buffer for actuating the SAR ADC and the reference buffer for actuating the sampling and digital-to-analog converting circuit can be reduced.

BRIEF DESCRIPTION OF THE DRAWINGS

The disclosure will become more fully understood from the detailed description given herein accompanying by the following figures, which are illustration only, and thus not limitative of the disclosure, wherein.

DETAILED DESCRIPTION

Figure 1:
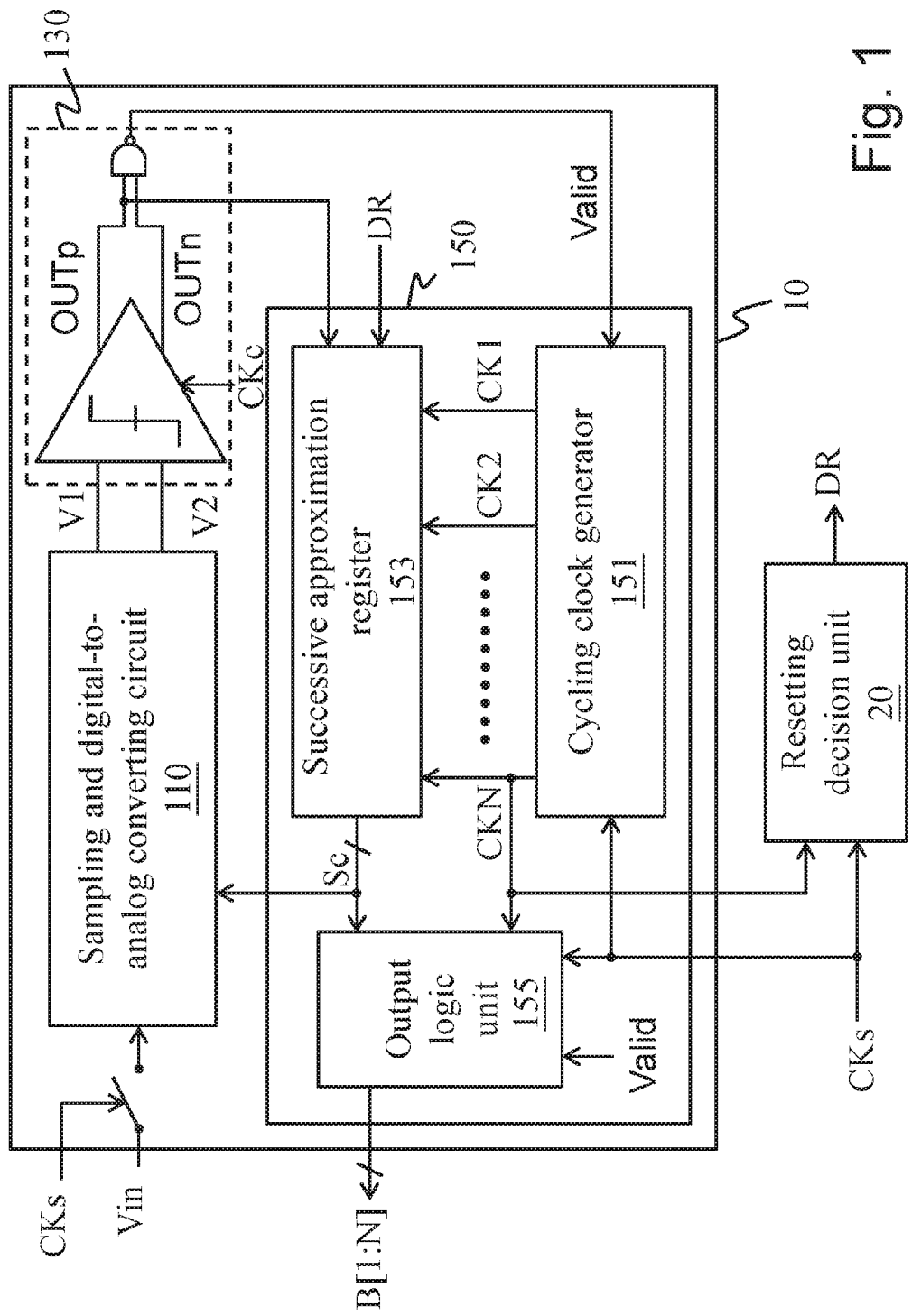
FIG. 1 illustrates a schematic view of an SAR analog-to-digital converting circuit of one embodiment of the instant disclosure.
Figure 2:
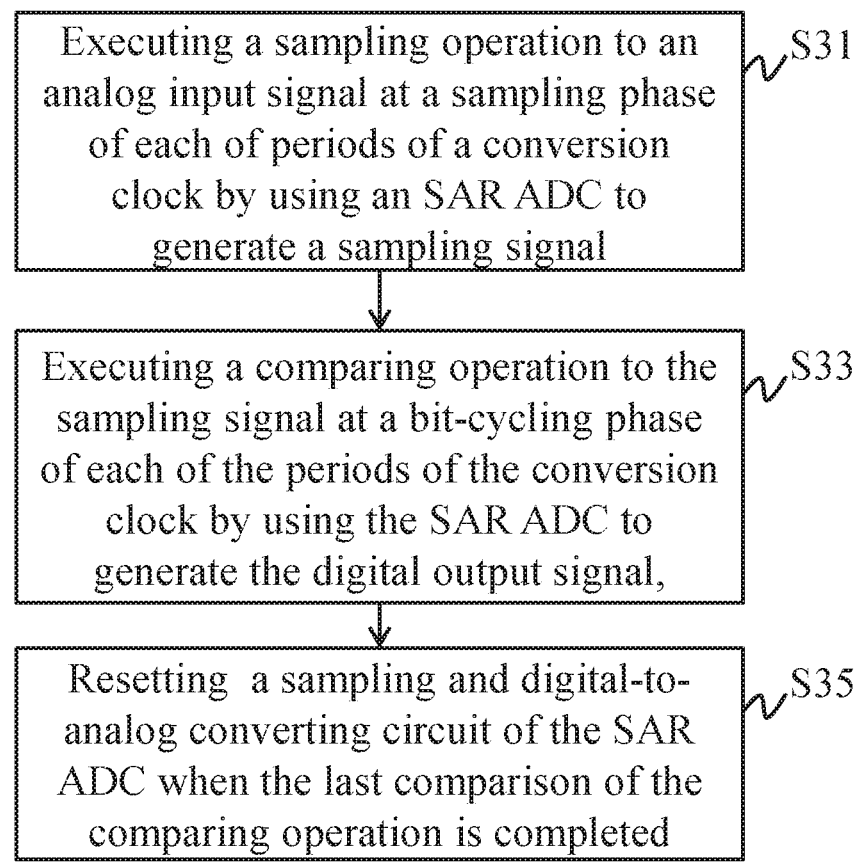
FIG. 2 illustrates a flowchart of an SAR analog-to-digital converting method of one embodiment of the instant disclosure.

FIG. 1 illustrates a schematic view of a successive approximation register (SAR) analog-to-digital converting circuit of one embodiment of the instant disclosure. FIG. 2 illustrates a flowchart of an SAR analog-to-digital converting method of one embodiment of the instant disclosure.

Please refer to FIG. 1. The SAR analog-to-digital converting circuit comprises an SAR analog-to-digital converter (ADC) 10 and a resetting decision unit 20. The SAR ADC 10 is coupled to the resetting decision unit 20. The SAR ADC 10 converts an analog input signal Vin into a corresponding digital output signal B [1:N] according to a conversion clock CKs. The conversion clock CKs has a plurality of periods, and each of the periods is divided into a sampling phase and a bit-cycling phase. Please refer to FIG. 2. At the sampling phase, the SAR ADC 10 executes a sampling operation on the analog input signal Vin to generate a sampling signal (step S31). At the bit-cycling phase, the SAR ADC 10 executes a comparing operation on the sampling signal to generate the digital output signal B [1:N] corresponding to the sampling signal (step S33). In other words, the SAR ADC 10 executes the sampling operation according to the sampling phase and executes the comparing operation according to the bit-cycling phase. During the comparing operation, the SAR ADC 10 executes N times of comparisons for sequentially determining N digital codes of the digital output signal B[1:N]. The resetting decision unit 20 resets a sampling and digital-to-analog converting circuit of the SAR ADC 10 when the last comparison is completed (step S35). Wherein N is positive integer.

In some embodiments, the SAR ADC 10 comprises a sampling and digital-to-analog converting circuit 110, a comparing circuit 130, and an SAR control circuit 150. The SAR control circuit 150 comprises a cycling clock generator 151, an SAR 153, and an output logic unit 155. The sampling and digital-to-analog converting circuit 110 is coupled to the two input ends of the comparing circuit 130, and the output end of the comparing circuit 130 is coupled to the cycling clock generator 151. The cycling clock generator 151 is coupled to the SAR 153, the output logic unit 155, and the resetting decision unit 20. The SAR 153 is coupled to the output logic unit 155 and the sampling and digital-to-analog converting circuit 110.

The operation of the SAR ADC 10 begins from the sampling operation. During the sampling operation, the SAR control circuit 150 uses a digital control signal Sc to control the sampling and digital-to-analog converting circuit 110, so that the sampling and digital-to-analog converting circuit 110 executes the sampling operation on the analog input signal Vin to generate a sampling signal.

Next, the SAR ADC 10 executes the comparing operation. The bit-cycling phase comprises N sequential-connected bit-determining durations (i.e., N times of comparisons). In this embodiment, the sampling and digital-to-analog converting circuit 110 converts one bit at one bit-determining duration, and the sampling and digital-to-analog converting circuit 110 converts the bits from the most significant bit (MSB) to the least significant bit (LSB).

In each of the bit determining duration, the SAR control circuit 150 uses the digital control signal Sc to control the sampling and digital-to-analog converting circuit 110, so that the sampling and digital-to-analog converting circuit 110 switches a bit switch and generates a first potential V1 and a second potential V2 according to the sampling signal. The comparing circuit 130 compares the first potential V1 of the sampling and digital-to-analog converting circuit 110 with the second potential V2 of the sampling and digital-to-analog converting circuit 100 to obtain comparing results OUTp, OUTn. The cycling clock generator 151 generates a plurality of ordered (i.e., may be sequentially-arranged) cycling clock signals CK1~CKN according to the operation state (i.e., the valid signal VALID) of the comparing circuit 130. The SAR 153 generates N digital codes as the control signal Sc for next bit determining duration according to the cycling clock signals CK1~CKN and the comparing result OUTp. At each of the bit determining duration, the output logic unit 155 stores the control signal Sc temporarily.

In addition, the output logic unit 155 outputs the temporarily-stored control signal Sc as the digital output signal B[1:N] according to the conversion clock Cks, the comparing result OUTp, and the last cycling clock signal CKN.

Figure 3:
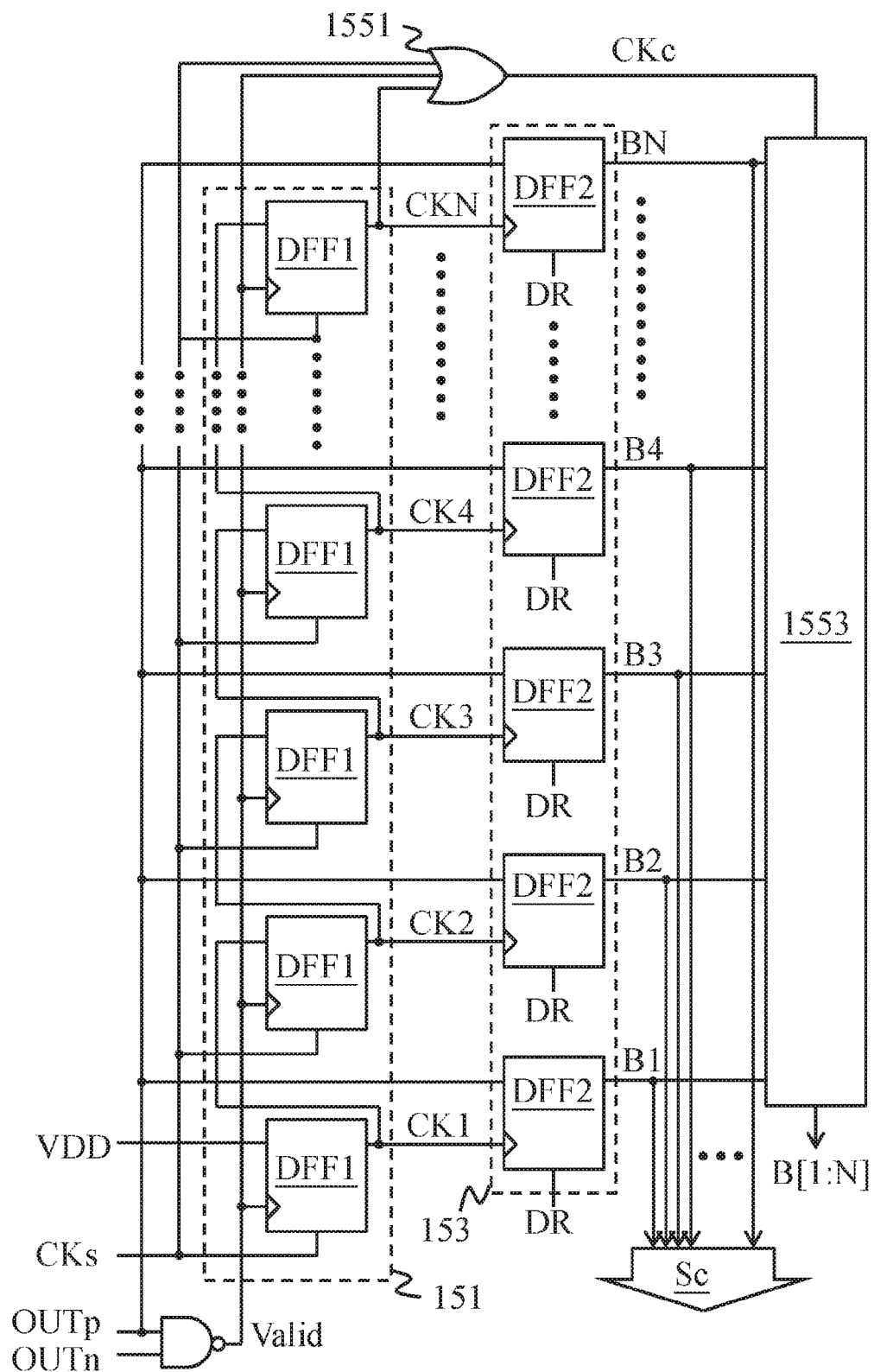
FIG. 3 illustrates a schematic view of one embodiment of an SAR control circuit shown in FIG. 1.

FIG. 3 illustrates a schematic view of one embodiment of an SAR control circuit 150 shown in FIG. 1.

In some embodiments, as shown in FIG. 3, the cycling clock generator 151 may be implemented by N serial-connected flip-flops DFF1. In some embodiments, the comparing circuit 130 may comprise a comparator and an NAND gate. The comparator compares the first potential V1 (the input of the positive end) with the second potential V2 (the input of the negative end), and the comparator outputs the comparing result OUTp (the output of the positive end) and the comparing result OUTn (the output of the negative end). The NAND gate determines if the output of the comparator is valid according to the comparing results OUTp, OUTn. In other words, the NAND gate executes a logic computation according to the comparing results OUTp, OUTn to generate the valid signal VALID. The first stage flip-flop DFF1 generates the cycling clock signal CK1 according to the valid signal VALID and the supply voltage VDD. The latter stage (i.e., the second stage) flip-flop DFF1 generates the cycling clock signal CK2 according to the valid signal VALID and the cycling clock signal CK1 (i.e., the former stage), the third stage flip-flop DFF1 generates the cycling clock signal CK3 according to the valid signal VALID and the cycling clock signal CK2, and so forth.

In some embodiments, as shown in FIG. 3, the SAR 153 may be implemented by N serial-connected flip-flops DFF2. The N flip-flops DFF2 respectively receive the cycling clock signals CK1~CKN. Each of the flip-flops DFF2 outputs a digital code according to the received cycling clock signal and the comparing result OUTp. The digital codes B1~BN outputted by the N flip-flops are provided as the digital control signal Sc and are inputted to a control end of the sampling and digital-to-analog converting circuit 110.

In some embodiments, as shown in FIG. 3, the output logic unit 155 comprises a logic unit 1551 and an output unit 1553. The output unit 1553 is coupled to the N flip-flops DFF2 of the SAR 153 and to the output end of the logic unit 1551. The logic unit 1551 receives the conversion clock CKs, the valid signal VALID, and the last cycling clock signal CKN, and the logic unit 1551 outputs a control clock CKc according to the conversion clock CKs, the valid signal VALID, and the last cycling clock signal CKN. The output unit 1553 records the digital codes B1~BN according to the control clock Cks and outputs the digital codes B1~BN as an output signal B[1:N] according to the control clock CKc. In some embodiments, the logic unit 1551 may be implemented by an OR gate. In some embodiments, the output unit 1553 may be implemented by a shift register.

Figure 4:
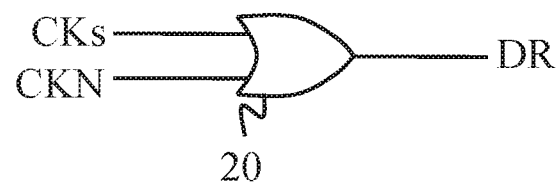
FIG. 4 illustrates a schematic view of one embodiment of a resetting decision unit shown in FIG. 1.

FIG. 4 illustrates a schematic view of one embodiment of a resetting decision unit 20 shown in FIG. 1.

In some embodiments, as shown in FIG. 1, the resetting decision unit 20 generates a reset signal DR according to the conversion clock CKs and the last cycling clock signal CKN, and the resetting decision unit 20 resets the N flip-flops DFF2 of the SAR 153 according to the reset signal DR, so that the digital codes B1~BN outputted by the N flip-flops DFF2 are reset. In this embodiment, the reset digital codes B1~BN are served as the digital control signal Sc and inputted into the control end of the sampling and digital-to-analog converting circuit 110 to reset the sampling and digital-to-analog converting circuit 110.

In some embodiments, the resetting decision unit 20 may be a logic element, and the logic element may be an OR gate. In other words, the resetting decision unit 20 receives the conversion clock CKs and the last cycling clock signal CKN and executes a logical computation for the conversion clock CKs and the last cycling clock CKN signal to output the reset signal DR.

Figure 5:
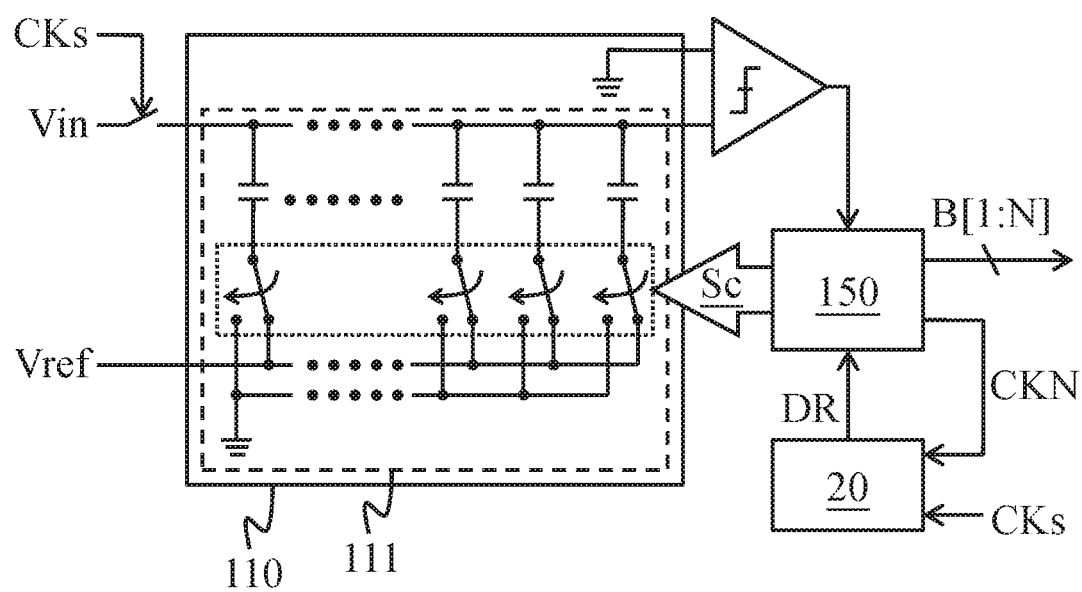
FIG. 5 illustrates a schematic view of one embodiment of a sampling and digital-to-analog converting circuit shown in FIG. 1.
Figure 6:
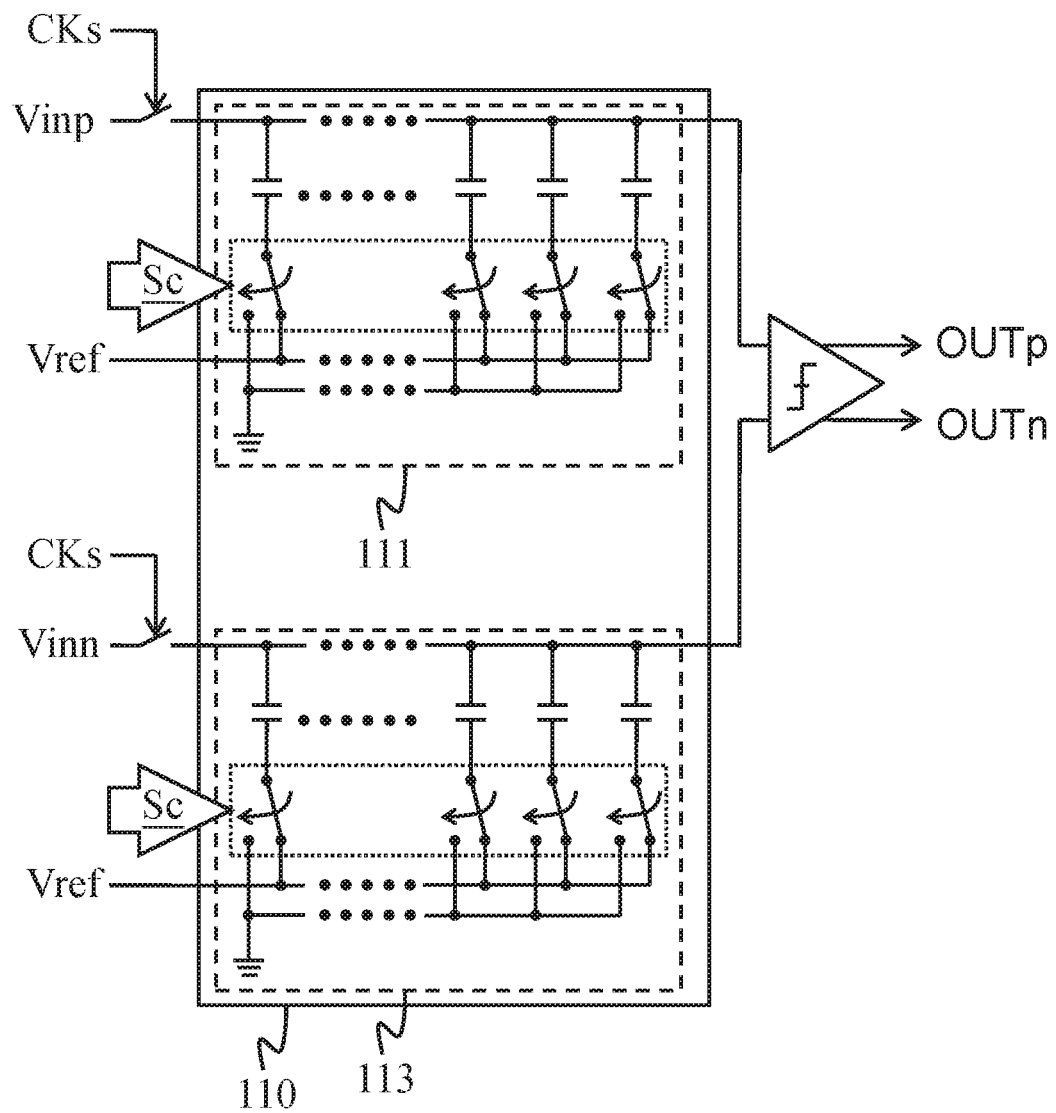
FIG. 6 illustrates a schematic view of another embodiment of a sampling and digital-to-analog converting circuit shown in FIG. 1.

FIG. 5 illustrates a schematic view of one embodiment of a sampling and digital-to-analog converting circuit 110 shown in FIG. 1. FIG. 6 illustrates a schematic view of another embodiment of a sampling and digital-to-analog converting circuit 110 shown in FIG. 1.

In some embodiments, as shown in FIG. 5 and FIG. 6, the sampling and digital-to-analog converting circuit 110 comprises at least one switched capacitor array 111, 113. The switched capacitor array 111, 113 comprises a plurality of groups of switch elements and capacitor elements, and the switch elements are serial-connected to the respective capacitor elements. Each of the switch elements couples (electrically connects) the corresponding capacitor element to a reference level Vref or to ground according to the corresponding digital code of the digital control signal Sc (i.e., one of the digital codes B1~BN). After the last comparison of the N times of comparisons is completed (i.e., when the cycling clock signal CKN is pulled up), the resetting decision unit 20 pulls up the reset signal DR according to the conversion clock CKs and the last cycling clock signal CKN for outputting a reset signal DR with high level. The reset ends of the N flip-flops DFF2 of the SAR 153 receive the high level reset signal DR and are reset accordingly. The reset N flip-flops DFF2 output a reset digital control signal Sc (i.e., reset digital codes B1~BN) to the switch elements of the switch capacitor array 111, 113 so that the reset digital control signal Sc controls each of the switch elements to electrically connect the corresponding capacitor element to the reference level Vref. In some embodiments, the analog input signal Vin may be a signal end signal. In some embodiments, the analog input signal Vin may comprise a positive end signal Vinp and a negative end signal Vinn.

Figure 7:
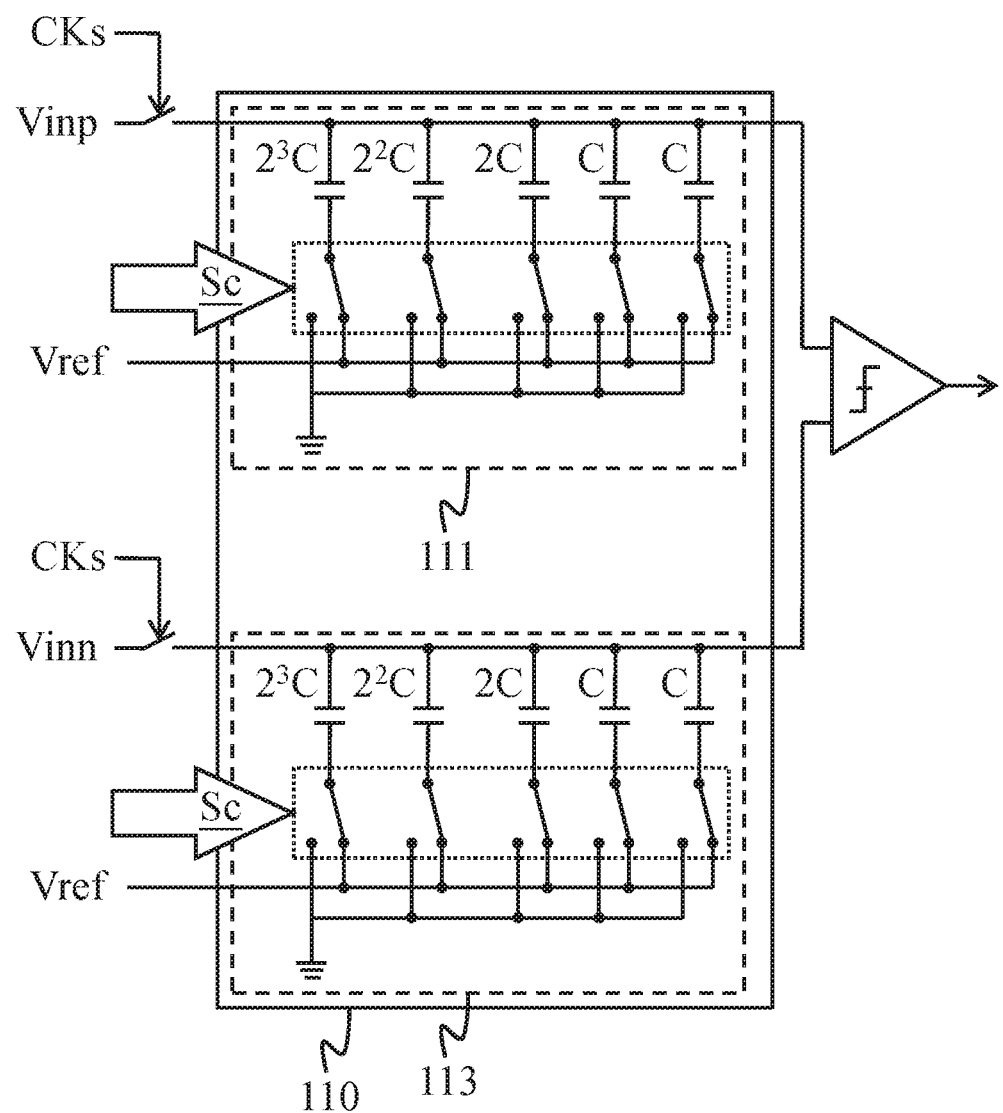
FIG. 7 illustrates a schematic view showing an example of a resetting state of the sampling and digital-to-analog converting circuit shown in FIG. 6.
Figure 8:
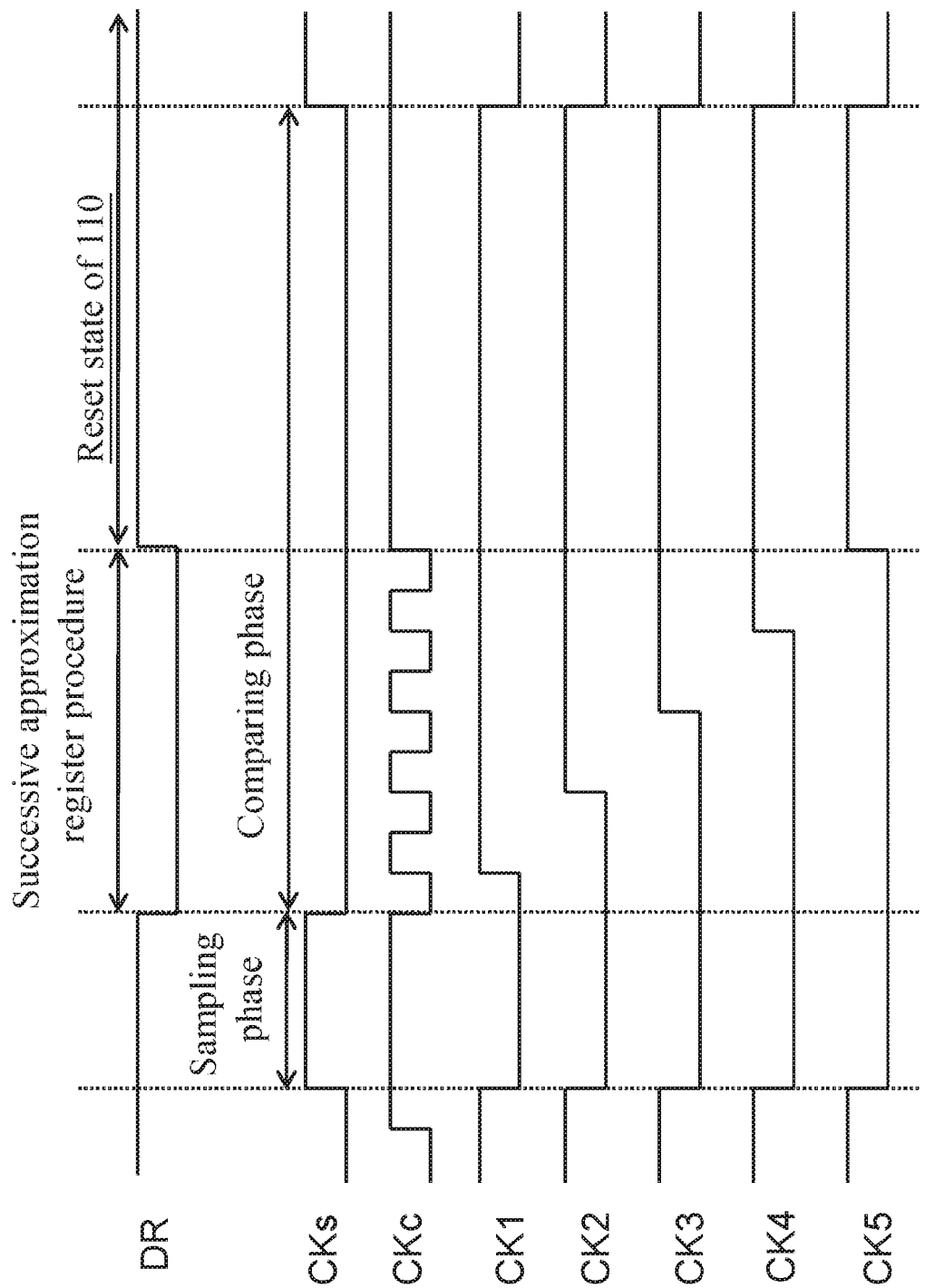
FIG. 8 illustrates a signal timing graph showing the signals of the SAR analog-to-digital converting circuit of FIG. 1 in a condition of N=5.

For example, in a 5 bits condition, when the last of the conversion clock signal CK5 is pulled up, the sampling and digital-to-analog converting circuit 100 is reset because of the pulling up of the reset signal DR. In other words, the switched capacitor arrays 111, 113 are coupled to the reference level Vref, while the input switch is remained off, as shown in FIG. 7. Specifically, a signal timing graph of the signals is shown in FIG. 8.

Based on the above, in the SAR analog-to-digital converting circuit and method thereof, the sampling and digital-to-analog converting circuit enters into the reset state after the SAR procedure is completed (i.e., when the last cycling clock signal is pulled up). Accordingly, the idle time of an existing SAR ADC can be provided for performing the actions of the sampling and digital-to-analog converting circuit and a reference buffer in advance. Therefore, the bandwidth requirements for resetting the sampling and digital-to-analog converting circuit can be reduced, and the bandwidth requirements for actuating the reference buffer can be reduced, too. In addition, because the lower plate of the sampling and digital-to-analog converting circuit enters into the reset state in advance, the upper plate of the sampling and digital-to-analog converting circuit would recover to the current sampling value. Hence, at the timing to enter into the next sampling phase, the common mode level of the SAR ADC is recovered to the common mode level of the input buffer, so that extra recovering time can be saved. Accordingly, based on the SAR analog-to-digital converting circuit and method thereof, the design costs of the input buffer for actuating the SAR ADC and the reference buffer for actuating the sampling and digital-to-analog converting circuit can be reduced.

What is claimed is:

1. A successive approximation register (SAR) analog-to-digital converting method, comprising:
   executing a sampling operation and a comparing operation according to a conversion clock by using an SAR analog-to-digital converter (ADC) to convert an analog input signal into a digital output signal; and
   resetting a sampling and digital-to-analog converting circuit of the SAR ADC when an SAR procedure of the comparing operation is completed;
   wherein the conversion clock comprises a plurality of periods, each of the periods comprises a sampling phase and a bit-cycling phase, and wherein the step of executing the sampling operation and the comparing operation according to the conversion clock by using the SAR analog-to-digital converter (ADC) to convert the analog input signal into the digital output signal comprises:
   executing the sampling operation on the analog input signal at each of the sampling phases by using the SAR ADC to generate a sampling signal; and
   executing the comparing operation on the sampling signal at each of the bit-cycling phase by using the SAR ADC to generate the digital output signal, wherein the SAR procedure comprises executing N comparisons for determining N digital codes of the digital output signal, where N is a positive integer.

2. The method according to claim 1, wherein each of the N comparisons comprises:
   generating a first potential and a second potential according to the sampling signal by using the sampling and digital-to-analog converting circuit controlled by a control signal;
   comparing the first potential with the second potential to obtain a comparing result;
   generating a plurality of ordered cycling clock signals according to the comparing result;
   generating the N digital codes according to the cycling clock signals and the comparing result;
   defining the N digital codes as the control signal for next comparison; and controlling output of the N digital codes according to the conversion clock, the comparing result, and the last cycling clock signal.

3. The method according to claim 2, wherein the step of resetting the sampling and digital-to-analog converting circuit of the SAR ADC when the SAR procedure of the comparing operation is completed comprises:
generating a reset signal according to the conversion clock and the last cycling clock signal; and
resetting the N digital codes according to the reset signal.

4. The method according to claim 3, wherein the step of generating the reset signal according to the conversion clock and the last cycling clock signal comprises:
performing a logical operation of the conversion clock and the last cycling clock signal to output the reset signal.

5. A successive approximation register (SAR) analog-to-digital converting circuit, comprising:
an SAR analog-to-digital converter (ADC), executing a sampling operation and a comparing operation according to a conversion clock to convert an analog input signal into a digital output signal, wherein the SAR ADC comprises:
a sampling and digital-to-analog converting circuit;
a comparing circuit, coupled to the sampling and digital-to-analog converting circuit; and
an SAR control circuit, coupled to the sampling and digital-to-analog converting circuit and the comparing circuit; and
a resetting decision unit, coupled to the SAR control circuit and the sampling and digital-to-analog converting circuit, detecting an SAR procedure of the comparing operation, and resetting the sampling and digital-to-analog converting circuit when the SAR procedure is completed;
wherein the SAR control circuit comprises:
a cycling clock generator, generating a plurality of ordered cycling clock signals according to a comparing result of the comparing circuit;
an SAR, generating N digital codes of the digital output signal according to the cycling clock signals and the comparing result, where N is a positive integer; and
an output logic unit, controlling output of the N digital codes to be the digital output signal according to the conversion clock, the comparing result, and the last cycling clock signal.

6. The SAR analog-to-digital converting circuit according to claim 5, wherein the resetting decision unit generates a reset signal according to the conversion clock and the last cycling clock signal, so that the reset signal resets the sampling and digital-to-analog converting circuit through resetting the SAR.

7. The SAR analog-to-digital converting circuit according to claim 5, wherein the resetting decision unit is a logical element, the logical element performs a logical operation of the conversion clock and the last cycling clock signal to output a reset signal, so that the reset signal resets the sampling and digital-to-analog converting circuit through resetting the SAR.

8. The SAR analog-to-digital converting circuit according to claim 5, wherein the sampling and digital-to-analog converting circuit comprises at least one switched capacitor array, and wherein when the SAR procedure is completed, the resetting decision unit generates a reset signal, and the switched capacitor array is coupled to a reference level according to the reset signal.

* * * * *